US012701770B2

(12) United States Patent
Chen

(10) Patent No.: US 12,701,770 B2
(45) Date of Patent: Aug. 4, 2026

(54) POWER MODULE INCLUDING A SEMICONDUCTOR DEVICE WITH PARASITIC DIODE

(71) Applicant: Hon Young Semiconductor Corporation, Hsinchu City (TW)

(72) Inventor: Yan-Ru Chen, Hsinchu City (TW)

(73) Assignee: Hon Young Semiconductor Corporation, Hsinchu City (TW)

( * ) Notice: Subject to any disclaimer, the term of this patent is extended or adjusted under 35 U.S.C. 154(b) by 619 days.

(21) Appl. No.: 18/169,218

(22) Filed: Feb. 15, 2023

(65) Prior Publication Data

US 2024/0105845 A1     Mar. 28, 2024

(30) Foreign Application Priority Data

Sep. 23, 2022    (TW) .................................. 111136236

(51) Int. Cl.
*H10D 64/64*       (2025.01)
*H10D 30/01*       (2025.01)
*H10D 30/60*       (2025.01)
*H10D 84/00*       (2025.01)

(52) U.S. Cl.
CPC ......... *H10D 64/647* (2025.01); *H10D 30/028* (2025.01); *H10D 30/601* (2025.01); *H10D 84/143* (2025.01); *H10D 84/146* (2025.01)

(58) Field of Classification Search
CPC .......... H10D 84/811–817; H10D 84/403–409; H10D 89/611; H10D 84/611–619; H10D 84/204; H10D 84/221; H10D 84/00;
H10D 64/251–259; H10D 30/6729–6739; H10D 30/6219; H10D 64/647–649; H10D 30/028; H10D 30/601; H10D 30/0295; H10D 30/66; H10D 84/146; H10D 84/144;

(Continued)

(56) References Cited

U.S. PATENT DOCUMENTS 5,233,215 A * 8/1993 Baliga .................. H10D 30/665
257/490
7,332,788 B2 * 2/2008 Ahlers ................... H10D 30/66
257/E21.418

(Continued)

FOREIGN PATENT DOCUMENTS

TW        201413981 A        4/2014
TW        201427035 A        7/2014
TW        202226592 A        7/2022

*Primary Examiner* — Maliheh Malek
(74) *Attorney, Agent, or Firm* — CKC & Partners Co., LLC

(57)        ABSTRACT
A semiconductor device includes a substrate, an epitaxial layer on the substrate, a first well region in the epitaxial layer, a source region in the first well region, a source contact, a base region wrapping around a sidewall of the source contact and a second well region wrapping around the base region. The substrate, the epitaxial layer and the source region include a plurality of dopants of a first semiconductor type. A bottom of the source contact is lower than a bottom of the first well region. The base region and the second well region include a plurality of dopants of a second semiconductor type. The second semiconductor type is different from the first semiconductor type, and a doping concentration of the base region is higher than a doping concentration of the first well region and a doping concentration of the second well region.

4 Claims, 19 Drawing Sheets

100

(58) Field of Classification Search
CPC ............. H10D 62/393; H10D 62/8325; H10D
64/2527; H10B 99/16
See application file for complete search history.

(56) References Cited

U.S. PATENT DOCUMENTS

| | | | | |
|---|---|---|---|---|
| 8,502,346 | B2 * | 8/2013 | Bhalla .................. | H10D 84/611 257/559 |
| 8,569,867 | B2 * | 10/2013 | Inaba .................. | H10D 18/251 257/574 |
| 8,704,295 | B1 * | 4/2014 | Darwish .................. | H10D 8/60 257/334 |
| 9,166,037 | B2 * | 10/2015 | Lin ...................... | H10D 30/668 |
| 9,269,806 | B2 * | 2/2016 | Tsai .................. | H10D 30/0281 |
| 9,324,625 | B2 * | 4/2016 | Ahlers .................. | H10D 30/66 |
| 9,564,515 | B2 * | 2/2017 | You .................... | H10D 30/0291 |
| 9,653,599 | B2 * | 5/2017 | Kobayashi .......... | H10D 64/647 |
| 9,997,358 | B2 * | 6/2018 | Wakimoto ......... | H10D 62/8325 |
| 10,141,410 | B2 * | 11/2018 | Shimizu .................. | H10D 8/60 |
| 10,283,634 | B2 * | 5/2019 | Haeberlen ........... | H10D 30/668 |
| 10,522,673 | B2 * | 12/2019 | Kobayashi .......... | H10D 84/146 |
| 10,580,878 | B1 * | 3/2020 | Joshi .................... | H10D 62/393 |
| 10,741,684 | B2 * | 8/2020 | Kocon ................. | H10D 64/117 |
| 10,770,581 | B2 * | 9/2020 | Kobayashi .......... | H10D 84/146 |
| 11,251,296 | B2 * | 2/2022 | Saggio ................ | H10D 30/668 |
| 11,532,721 | B2 * | 12/2022 | Shimizu .................. | H10D 8/60 |
| 11,901,430 | B2 * | 2/2024 | Shimizu .................. | H10D 8/60 |
| 2005/0017325 | A1 * | 1/2005 | Gris ........................ | H10D 10/40 257/E21.375 |
| 2008/0197446 | A1 * | 8/2008 | Disney ............... | H10W 10/051 257/E21.546 |
| 2009/0212354 | A1 * | 8/2009 | Hsieh .................. | H10D 84/148 257/E27.016 |
| 2010/0163978 | A1 * | 7/2010 | Magri .................. | H10D 64/661 257/334 |
| 2011/0297964 | A1 * | 12/2011 | Miura .................. | H10D 30/669 257/E27.06 |
| 2012/0049940 | A1 * | 3/2012 | Frisina ................ | H10D 84/146 257/E29.171 |
| 2012/0193701 | A1 * | 8/2012 | Lin ........................ | H10D 89/60 438/237 |
| 2014/0210002 | A1 * | 7/2014 | Sawase ................ | H10D 62/371 257/334 |
| 2015/0053999 | A1 * | 2/2015 | Kumagai .......... | H10D 62/8303 257/77 |
| 2015/0162410 | A1 * | 6/2015 | Padmanabhan ........ | H10D 30/60 257/488 |
| 2016/0260709 | A1 * | 9/2016 | Rupp .................. | H10D 84/617 |
| 2016/0260798 | A1 * | 9/2016 | Rupp .................. | H10D 62/405 |
| 2017/0054012 | A1 * | 2/2017 | Hutzler ............... | H10D 12/481 |
| 2017/0133504 | A1 * | 5/2017 | Shiomi .................. | H10D 30/63 |
| 2017/0200787 | A1 * | 7/2017 | Shimizu .................. | H10D 8/60 |
| 2018/0096991 | A1 * | 4/2018 | Nasu ..................... | H10D 84/83 |
| 2018/0122926 | A1 * | 5/2018 | Menta .................. | H10D 12/481 |
| 2018/0182750 | A1 * | 6/2018 | Burke ................. | H10D 64/117 |
| 2018/0261680 | A1 * | 9/2018 | Park .................. | H10D 12/038 |
| 2018/0301536 | A1 * | 10/2018 | Utsumi ............... | H10D 30/668 |
| 2019/0109228 | A1 * | 4/2019 | Kobayashi .......... | H10D 30/668 |
| 2020/0083368 | A1 * | 3/2020 | Kobayashi ......... | H10D 30/0295 |
| 2020/0365726 | A1 * | 11/2020 | Hoshi ............... | H10D 30/669 |
| 2021/0257460 | A1 * | 8/2021 | Rahimo .............. | H10D 12/441 |
| 2021/0280723 | A1 * | 9/2021 | Blackwell ................. | G05F 3/30 |
| 2021/0384298 | A1 * | 12/2021 | Hoshi ................. | H10D 30/669 |
| 2024/0079489 | A1 * | 3/2024 | Chiang ............. | H10D 30/0291 |
| 2024/0097019 | A1 * | 3/2024 | Hsiao ..................... | H10D 30/66 |
| 2024/0105830 | A1 * | 3/2024 | Chen ..................... | H10D 30/66 |
| 2024/0297223 | A1 * | 9/2024 | Matsunaga ........... | H10D 62/81 |
| 2024/0363692 | A1 * | 10/2024 | Tawara ................ | H10D 62/106 |
| 2024/0395877 | A1 * | 11/2024 | Hsieh .................. | H10D 64/117 |

* cited by examiner

100

120

110

100

123

123

122

120

110

100

100'

POWER MODULE INCLUDING A SEMICONDUCTOR DEVICE WITH PARASITIC DIODE

CROSS-REFERENCE TO RELATED APPLICATION

This application claims priority to Taiwan Application Serial Number 111136236, filed Sep. 23, 2022, which is herein incorporated by reference in its entirety.

BACKGROUND

Field of Invention

The present disclosure relates to a semiconductor device and a manufacturing method thereof.

Description of Related Art

In power modules, a transistor and a diode connected in parallel with the diode are included. The diode connected in parallel with the transistor may be used to protect overall circuits. For example, the diode may be used to prevent the transistors from being turned on at the same time. Moreover, the diode may also be used to improve the performance of the power module. For example, the reverse recovery characteristics are significantly enhanced.

SUMMARY

Some embodiments of the present disclosure provides a semiconductor device including a substrate, an epitaxial layer, a first well region, a source region, a source contact, a base region and a second well region. The epitaxial layer is on the substrate. The first well region is in the epitaxial layer. The source region is in the first well region, and the substrate, the epitaxial layer and the source region include a plurality of dopants of a first semiconductor type. A bottom of the source contact is lower than a bottom of the first well region. The base region wraps around a sidewall of the source contact. The second well region wraps around the base region, and the first well region, the base region and the second well region include a plurality of dopants of a second semiconductor type. The second semiconductor type is different from the first semiconductor type, and a doping concentration of the base region is higher than a doping concentration of the first well region and a doping concentration of the second well region.

In some embodiments, a lower portion of the source contact and the source region are separated by the base region.

In some embodiments, the base region and the source region are separated by the second well region.

In some embodiments, a bottom of the base region is lower than the bottom of the first well region.

In some embodiments, the second well region is closer to the substrate than the first well region is.

Some embodiments of the present disclosure provides a semiconductor device includes a substrate, an epitaxial layer, a well region, a source region, a base region, a source contact, a gate dielectric layer and a gate layer. The epitaxial layer is on the substrate. The well region is in the epitaxial layer. The source region is in the well region. The substrate, the epitaxial layer and the source region include a plurality of dopants of a first semiconductor type. The base region is in the well region. The well region and the base region includes a plurality of dopants of a second semiconductor type, the second semiconductor type is different from the first semiconductor type, and a doping concentration of the base region is higher than a doping concentration of the well region. The source contact penetrates through a bottom of the well region and a bottom of the base region, a bottom of the source contact is lower than the bottom of the well region, and the bottom of the source contact is in contact with the epitaxial layer. The gate dielectric layer is on the epitaxial layer and covers a portion of the well region. The gate layer is on the gate dielectric layer.

In some embodiments, the source contact and the source region are at the opposite sides of the base region.

In some embodiments, a portion of a sidewall of the source contact is on contact with the well region.

In some embodiments, the source region is not contact with a sidewall of the source contact.

In some embodiments, the source contact is contact with a sidewall and a top surface of the base region.

Some embodiments of the present disclosure provides a manufacturing method of forming a semiconductor device, including forming an epitaxial layer on a substrate, forming a first well region in the epitaxial layer, forming a source region in the first well region, forming an opening in the epitaxial layer, wherein a bottom of the opening is lower than a bottom of the first well region, forming a base region along a sidewall of the opening, forming a gate dielectric layer and a gate layer on the epitaxial layer, and forming a source contact in the opening.

In some embodiments, the manufacturing method further includes forming a second well region in the first well region after forming the first well region in the epitaxial layer, and the second well region extends downwards from the first well region to the epitaxial layer.

In some embodiments, the base region is wrapped around by the second region.

In some embodiments, the substrate, the epitaxial layer and the source region comprise a plurality of dopants of a first semiconductor type, and the first well region, the base region and the second well region comprise a plurality of dopants of a second semiconductor type, the second semiconductor type is different from the first semiconductor type.

In some embodiments, a lower portion of the source contact and the epitaxial layer are separated by the base region and the second well region.

In some embodiments, the base region wraps around a sidewall of the source contact.

In some embodiments, a bottom of the base region is in contact with the first well region.

In some embodiments, a bottom and a portion of a sidewall of the source contact is in contact with the epitaxial layer.

In some embodiments, a width of the gate layer is less than a width of the gate dielectric layer.

In some embodiments, the manufacturing method further includes forming a drain electrode below the substrate after forming the source contact in the opening.

In some embodiments of the present disclosure, the parasitic diode in the MOSFET is directly used to protect the overall circuit and enhance overall performance by increasing the current of the parasitic diode. As such, additional diode may be omitted in the power module to reduce the cost of the power module.

It is to be understood that both the foregoing general description and the following detailed description are by examples, and are intended to provide further explanation of the description as claimed.

US 12,701,770 B2

DETAILED DESCRIPTION

Some embodiments of the present disclosure are related to structures of parasitic diodes in metal oxide semiconductor field effect transistors (MOSFET). The parasitic diodes are the diodes naturally formed in the MOSFET when forming the MOSFET. When the MOSFET is turned on, current may flow from the source, through the channel region to the drain, or current may flow from the source, through the parasitic diode to the drain. Generally, in a power module, a MOSFET usually is connected in parallel with a diode to protect the overall circuit or enhance overall performance. In some embodiments of the present disclosure, the parasitic diode in the MOSFET is used to protect the overall circuit and enhance overall performance by increasing the current of the parasitic diode. As such, additional diode may be omitted in the power module to reduce the cost of the power module and also reduce the size of the power module.

Figure 1:
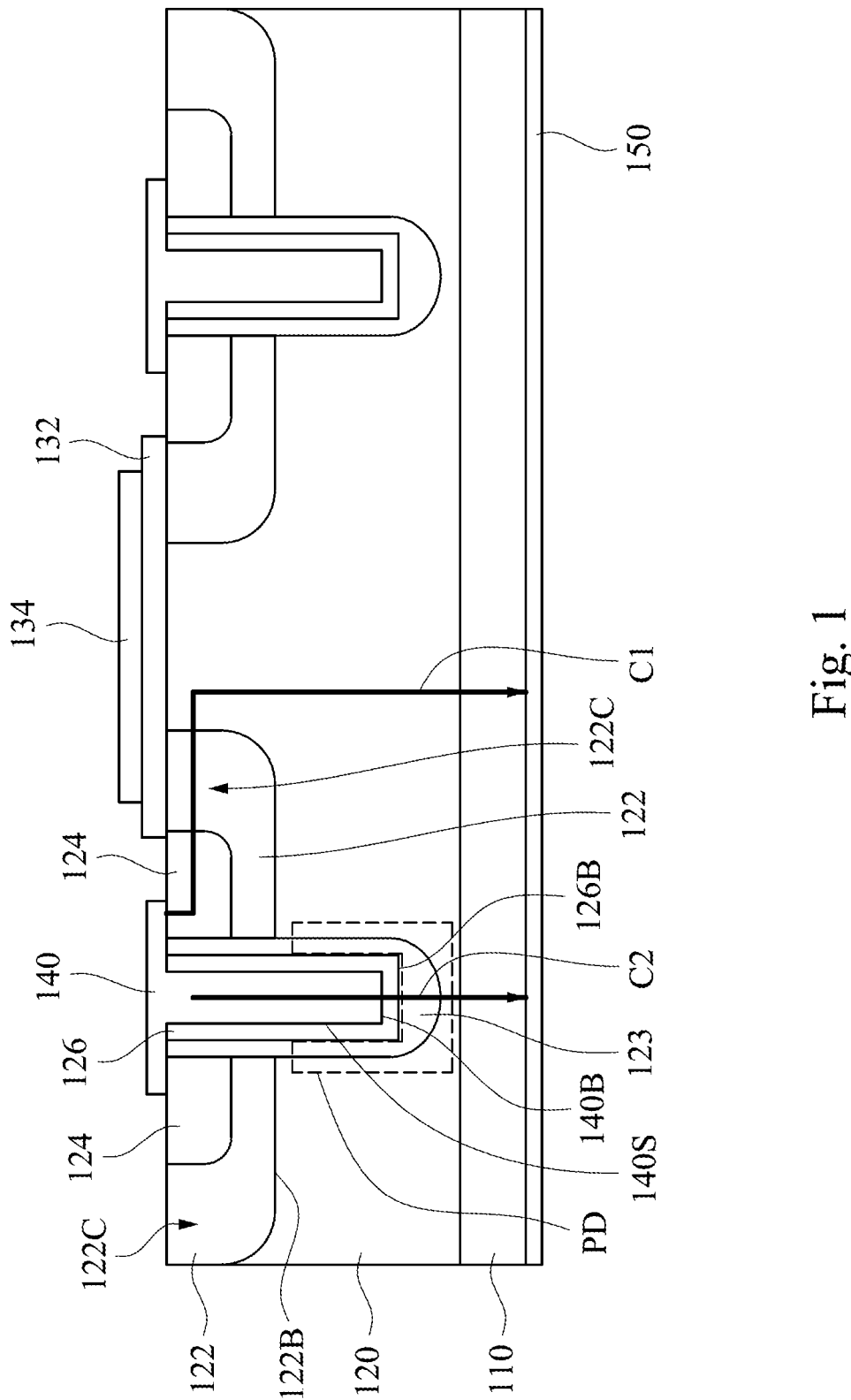
FIG. 1 illustrates a cross-section view of a semiconductor device in some embodiments of the present disclosure.

FIG. 1 illustrates a cross-section view of a semiconductor device 100 in some embodiments of the present disclosure. The semiconductor device 100 includes a substrate 110, an epitaxial layer 120, first well regions 122, second well regions 123, source regions 124, source contacts 140 and base regions (may also be called as body region) 126.

The epitaxial layer 120 is on the substrate 110. The first well region 122, the source region 124 and the second well region 123 are doped regions in the epitaxial layer 120. Moreover, the base region 126 may be the different epitaxial layer from the epitaxial layer 120. Specifically, the first well region 122 is in the epitaxial layer 120. The source region 124 is in the first well region 122. The substrate 110, the epitaxial layer 120 and the source region 124 include a plurality of dopants of a first semiconductor type. The first well region 122 includes a channel region 122C adjacent to the source region 124. The bottom 140B of the source contact 140 is lower than the bottom 122B of the first well region 122. The base region 126 wraps around a sidewall 140S of the source contact 140. The bottom 126B of the base region 126 is lower than the bottom 122B of the first well region 122. The second well region 123 wraps around the base region 126. The first well region 122, the base region 126 and the second well region 123 include a plurality of dopants of a second semiconductor type. The second semiconductor type is different from the first semiconductor type, and a doping concentration of the base region 126 is higher than a doping concentration of the first well region 122 and a doping concentration of the second well region 123. The doping concentration of the second well region 123 is substantially the same as the doping concentration of the first well region 122. That is, the first well region 122, the base region 126 and the second well region 123 are doped with the dopants of the same semiconductor type, and substrate 110, the epitaxial layer 120 and the source regions 124 are doped with the dopants of another semiconductor type. In some embodiments, the first well region 122 and the second well region 123 may be P-type lightly doped region, and the base region 126 may be P-type heavily doped region. The source region 124 and the substrate 110 may be N-type heavily doped region. The epitaxial layer 120 may be N-type lightly doped region. It is noted that although the first well region 122 and the second well region 123 have a boundary therebetween in FIG. 1, it is merely for convenience to describe the technical characteristics of the present disclosure. The first well region 122 and the second well region 123 may not have the boundary therebetween actually.

The semiconductor device 100 further includes a gate dielectric layer 132, a gate layer 134 and a drain electrode 150. The gate dielectric layer 132 is on the epitaxial layer 120 and covers a portion of the first well region 122. The gate layer 134 is on the gate dielectric layer 132, and the portion of the first well region 122 below the gate layer 134 is the channel region 122C. The drain electrode 150 is below the substrate 110.

In the semiconductor device 100, the source contact 140 is electrically connected to other components. When a voltage is provided to the gate layer 134 (i.e. the transistor is "on"), electron flow may flow from the source contact 140 to the drain electrode 150 along the first path C1 and the second path C2. In the first path C1, the electron flow flows from the source contact 140, through the source region 124, the channel region 122C, the epitaxial layer 120 and substrate 110 to the drain electrode 150. In the second path C2, the electron flow flows from the source contact 140, through the base region 126, the first well region 122, the epitaxial layer 120 and the substrate 110 to the drain electrode 150. When the electron flow flows along the second path C2, the electron flow flows from the second well region 123 of the second semiconductor type to the epitaxial layer 120 of the first semiconductor type. The electron flow flows through the P-N junction between the second well region 123 and the epitaxial layer 120. That is, the semiconductor device 100 may automatically forms a parasitic diode PD. In some embodiments, the parasitic diode PD may be a P—N diode. The second well region 123 of the parasitic diode PD in the semiconductor device 100 extends to the epitaxial layer 120. Therefore, the P-N junction between the second well region 123 and the epitaxial layer 120 becomes bigger, thereby increasing the electron flow of the parasitic diode PD of the semiconductor device 100. As such, parasitic diode PD may be directly used to protect the overall circuit and enhance overall performance, thereby reducing the cost of the power module.

Figure 2:
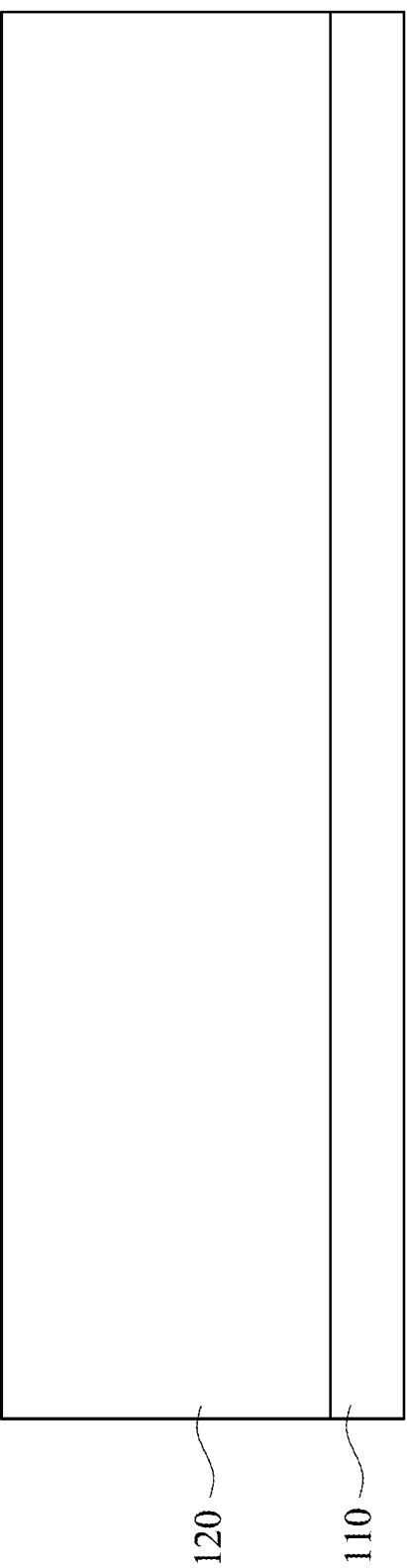
FIGS. 2-10 illustrate cross-section views of the manufacturing method of the semiconductor device in some embodiments of the present disclosure.

FIGS. 2-10 illustrate cross-section views of the manufacturing method of the semiconductor device 100 in some embodiments of the present disclosure. Referring to FIG. 2, the substrate 110 and the epitaxial layer 120 are provided. The substrate 110 may be any suitable substrate. In some embodiment, the substrate 110 may be made of (but not limited to) silicon carbide. The substrate 110 may be doped with dopants of the first semiconductor type. For example, the substrate 110 may be N-type heavily doped substrate, such as the heavily doped region including N-type dopants such as phosphorous, arsenic, etc. Subsequently, the epitaxial layer 120 is formed on the substrate 110. In some embodiments, the epitaxial layer 120 may be made of (but not limited to) silicon carbide. The epitaxial layer 120 may be doped with dopants of the first semiconductor type. For example, the epitaxial layer 120 may be N-type lightly doped substrate, such as the lightly doped region including N-type dopants such as phosphorous, arsenic, etc. That is, the doping concentration of the epitaxial layer 120 may be lower than that of the substrate 110.

Figure 3:
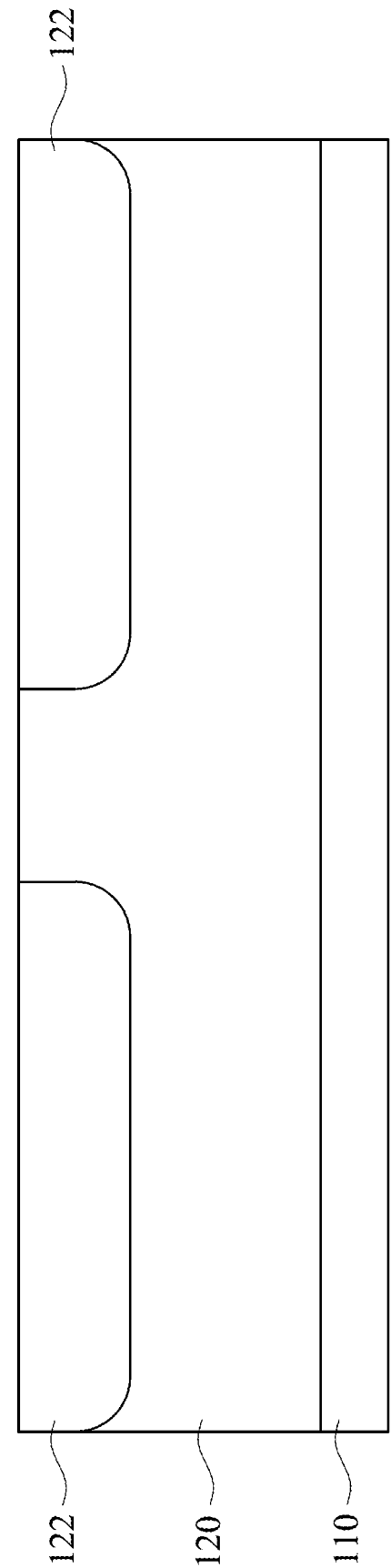

Referring to FIG. 3, a plurality of the first well regions 122 is formed in the epitaxial layer 120. Specifically, a patterned mask layer is formed on the epitaxial layer 120. Subsequently, an ion implantation is performed to implant the dopants of the second semiconductor type from above of the epitaxial layer 120 to form the first well region 122 having the dopants of the second semiconductor type. After the ion implantation process, the patterned mask layer may be removed. The adjacent first well regions 122 are separated by the epitaxial layer 120. In some embodiments, the first well region 122 may be P-type lightly doped substrate, such as the lightly doped region including P-type dopants such as boron, gallium, etc.

Figure 4:
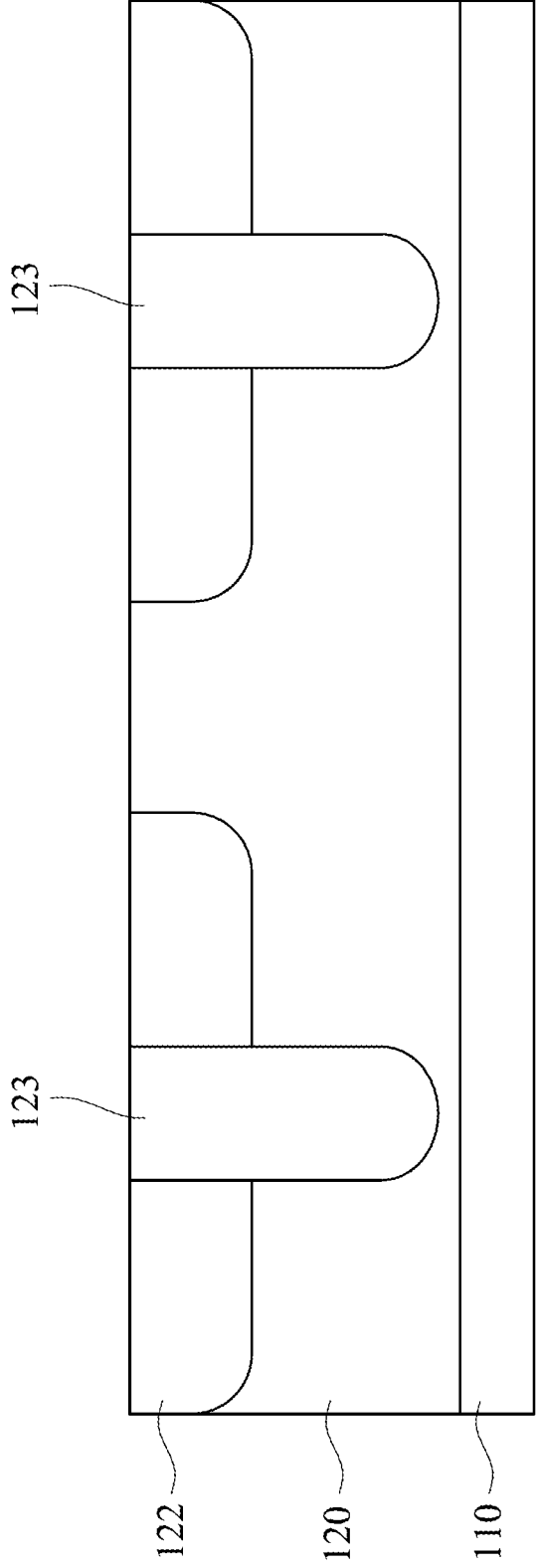

Referring to FIG. 4, a plurality of the second well regions 123 are formed in the first well regions 122, and the second well region 123 extends downwards from the first well region 122 to the epitaxial layer 120. Therefore, the second well region 123 is closer to the substrate 110 than the first well region 122 is. Specifically, a patterned mask layer is formed on the epitaxial layer 120. Subsequently, an ion implantation is performed to implant the dopants of the second semiconductor type from above of the epitaxial layer 120 to form the second well region 123 having the dopants of the second semiconductor type. After the ion implantation process, the patterned mask layer may be removed. In some embodiments, the second well region 123 may be P-type lightly doped substrate, such as the lightly doped region including P-type dopants such as boron, gallium, etc. Moreover, the doping concentration of the first well region 122 is substantially the same as the doping concentration of the second well region 123.

Figure 5:
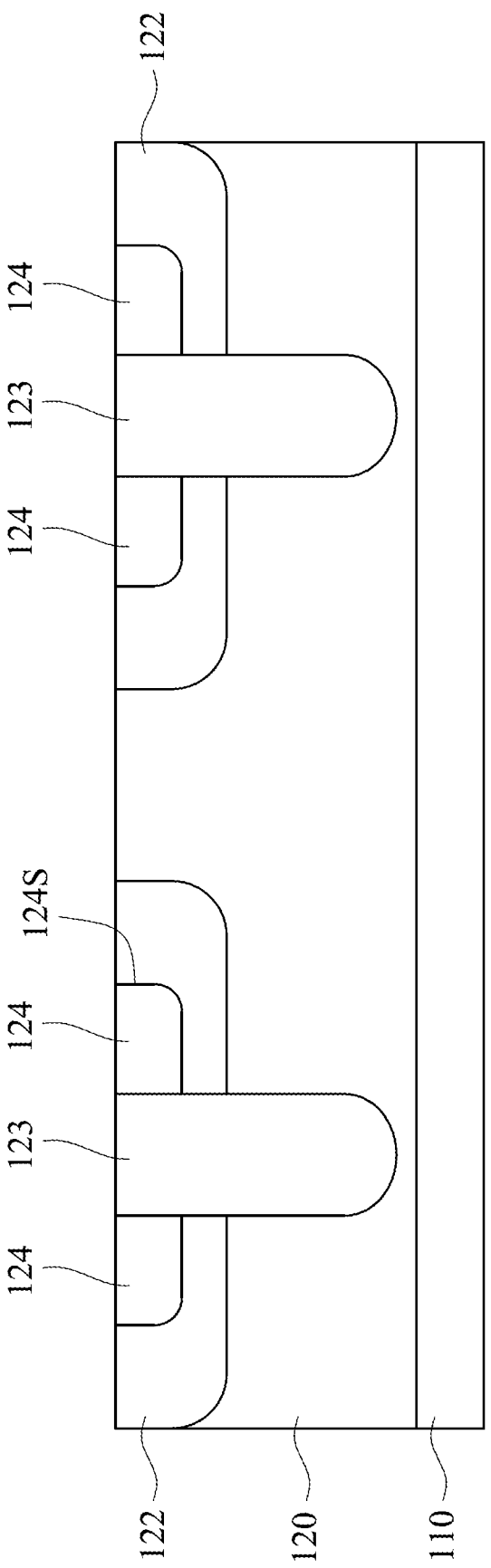

Referring to FIG. 5, the source region 124 is formed in the first well region 122. Specifically, another patterned mask layer is formed on the epitaxial layer 120. Subsequently, an ion implantation is performed to implant the dopants of the first semiconductor type from above of the first well region 122 to form the source region 124 having the dopants of the first semiconductor type. After the ion implantation process, the patterned mask layer may be removed. The sidewall 124S and the bottom of the source region 124 is wrapped around by the first well region 122. The source regions 124 are separated by the second well region 123, and the first well region 122 adjacent to the sidewall 124S may serve as the channel region 122C of the semiconductor device 100. In some embodiments, the source regions 124 may be N-type heavily doped substrate, such as the heavily doped region including N-type dopants such as phosphorous, arsenic, etc. That is, the doping concentration of the source region 124 is higher than the doping concentrations of the epitaxial layer 120.

Figure 6:
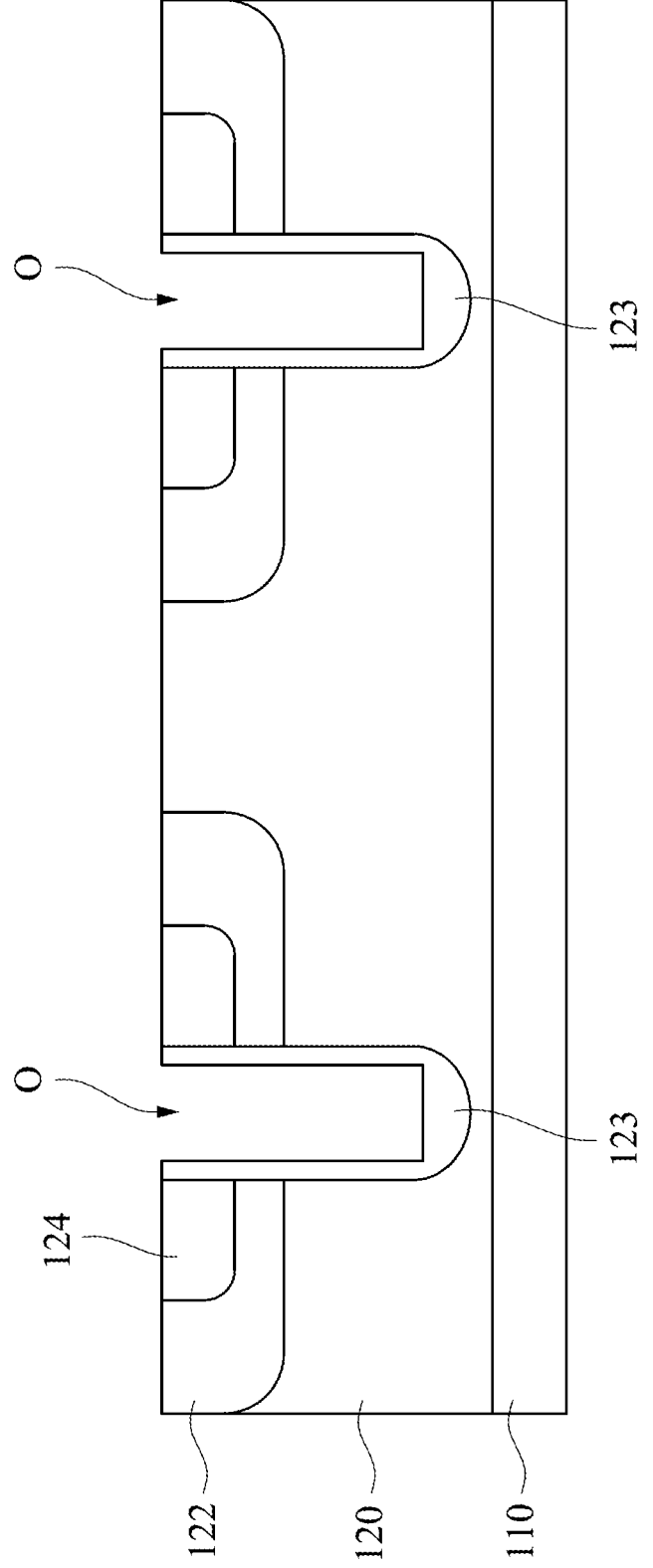

Referring to FIG. 6, openings O wrapped around by the second well regions 123 are formed in the epitaxial layer 120, and the bottoms of the openings O is lower than the bottoms 122B of the first well regions 122. In some embodiments, the openings O are formed by an etching process. The opening O extends from the source region 124 to the epitaxial layer 120. The bottom of the opening O is in the second well region 123 of the epitaxial layer 120. That is, the opening O is not in contact with/does not expose the substrate 110.

Figure 7:
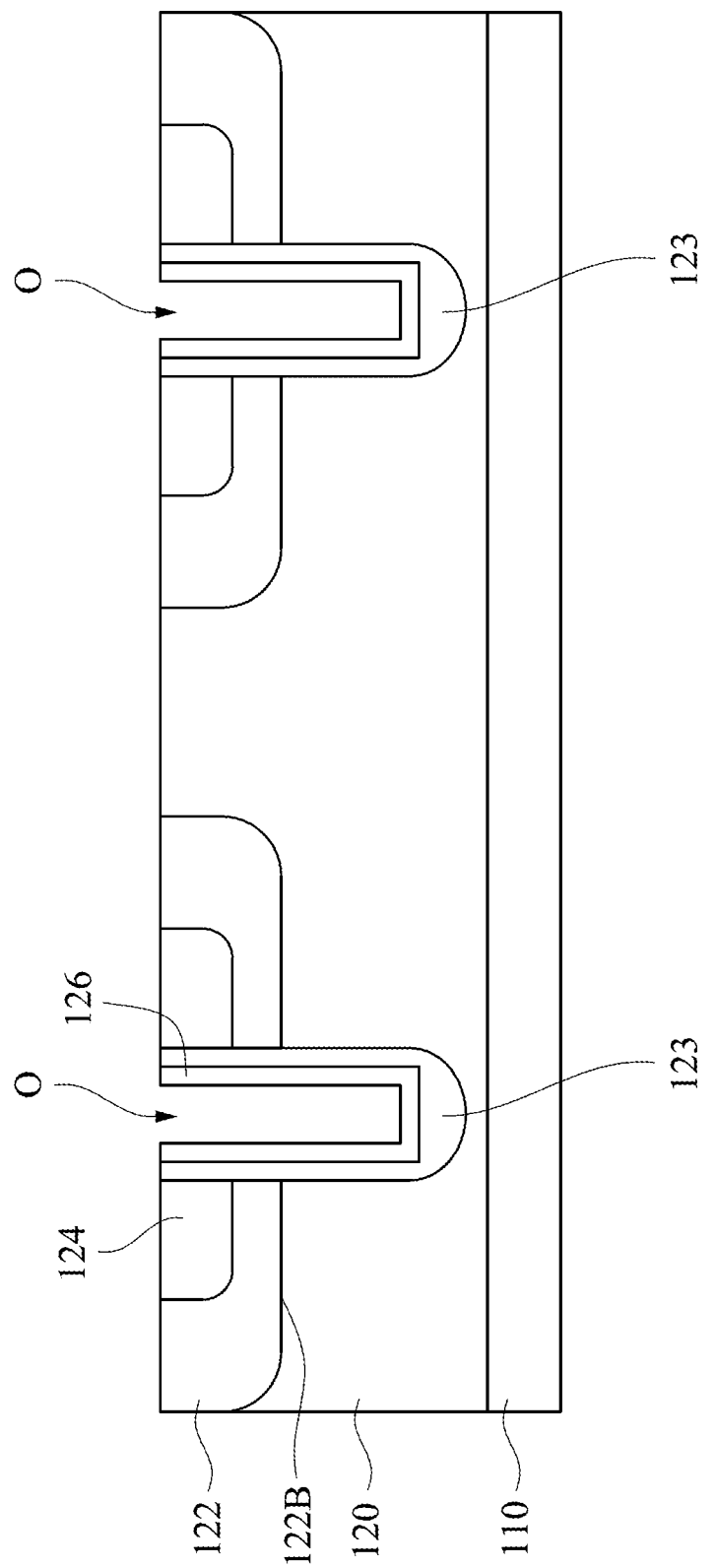

Referring to FIG. 7, the base regions 126 are formed along the sidewalls of the openings O. Specifically, an epitaxial layer of the second semiconductor type is formed along the sidewall, the bottom of the opening O and the top surface of the epitaxial layer 120. Subsequently, the epitaxial layer on the top surface of the epitaxial layer 120 is removed to form the base region 126 along the sidewall and the bottom of the opening O. In this process, the base region 126 extends to below the bottom 122B of the first well region 122, and the base region 126 is wrapped around by the second well region 123. In some embodiments, when forming the base region 126, higher doses of P-type dopants, such as boron gallium, etc., are implanted. That is, the doping concentration of the base region 126 is higher than the doping concentration of the first well region 122. Moreover, the bottom of the base region 126 is not contact with the substrate 110.

Figure 8:
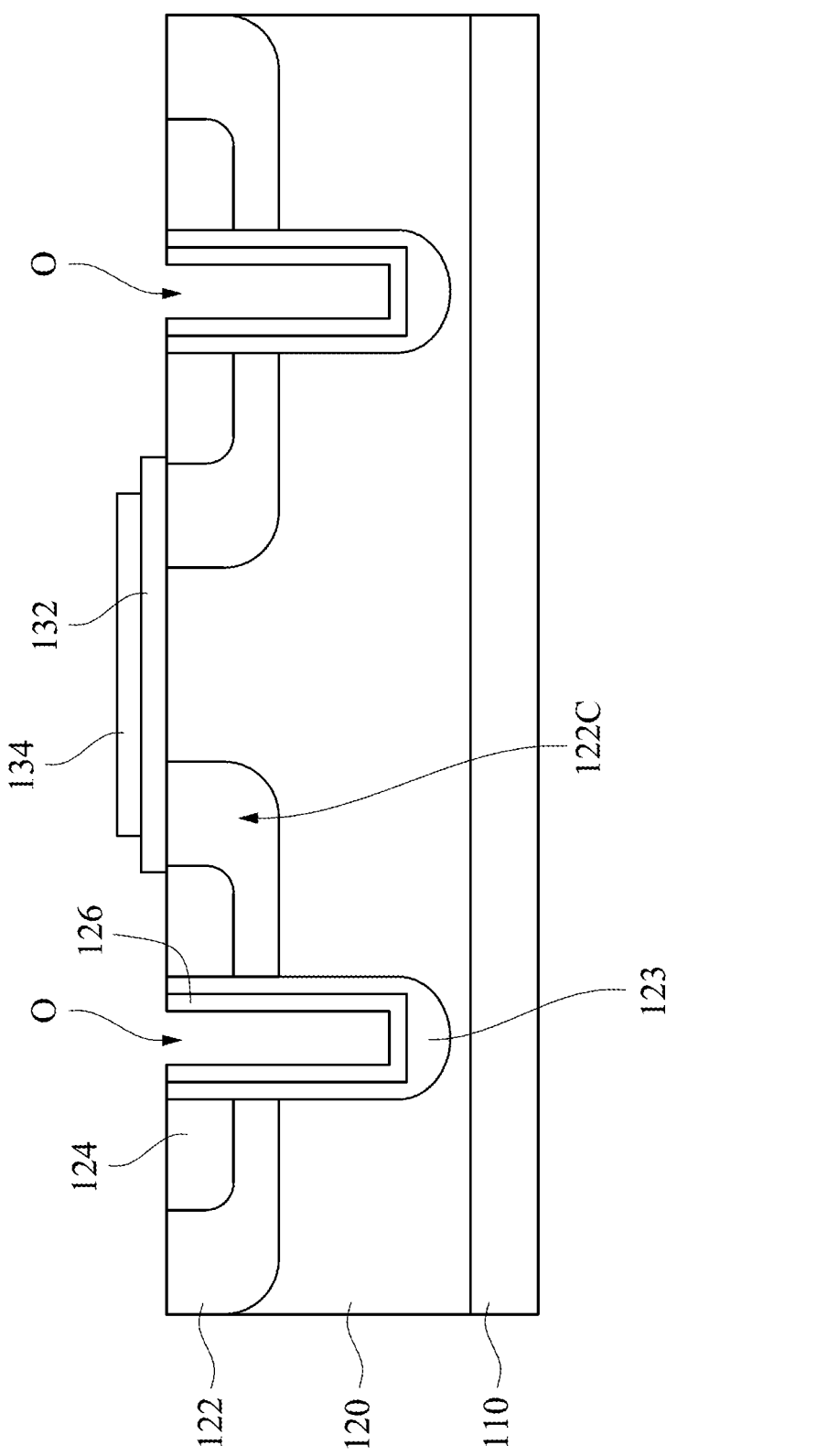

Referring to FIG. 8, the gate dielectric layer 132 and the gate layer 134 are formed on the epitaxial layer 120. Specifically, in some embodiments, a dielectric layer may be first conformally formed on the structure in FIG. 7. Subsequently, the dielectric layer is patterned to form the gate dielectric layer 132. The gate dielectric layer 132 covers a portion of the first well region 122, for example, the gate dielectric layer 132 covers the channel region 122C. Also, the gate dielectric layer 132 covers the epitaxial layer 120 between the adjacent two first well regions 122, and the gate dielectric layer 132 extends from above a channel region 122C to above another channel region 122C. Subsequently, a semiconductor layer is conformally formed on the structure and the gate dielectric layer 132 in FIG. 7. Subsequently, the semiconductor layer is patterned to form the gate layer 134. In some embodiments, the width of the gate layer 134 is less than the width of the gate dielectric layer 132. Therefore, the gate layer 134 exposes a portion of the gate dielectric layer 132, as shown in FIG. 8.

In some other embodiments, a dielectric layer and a semiconductor layer are formed on the structure in FIG. 7 in sequence. Subsequently, the semiconductor layer is first patterned to form the gate layer 134, and the dielectric layer is patterned to form the gate dielectric layer 132 by using the gate layer 134 as a mask. Therefore, the sidewall of the gate layer 134 is aligned with the sidewall of the gate dielectric layer 132. In some embodiments, the gate dielectric layer 132 may be made of (but not limited to) SiO, SiN, SiON, combinations thereof, or the like. In some embodiments, the gate layer 134 may be made of (but not limited to) poly silicon.

Figure 9:
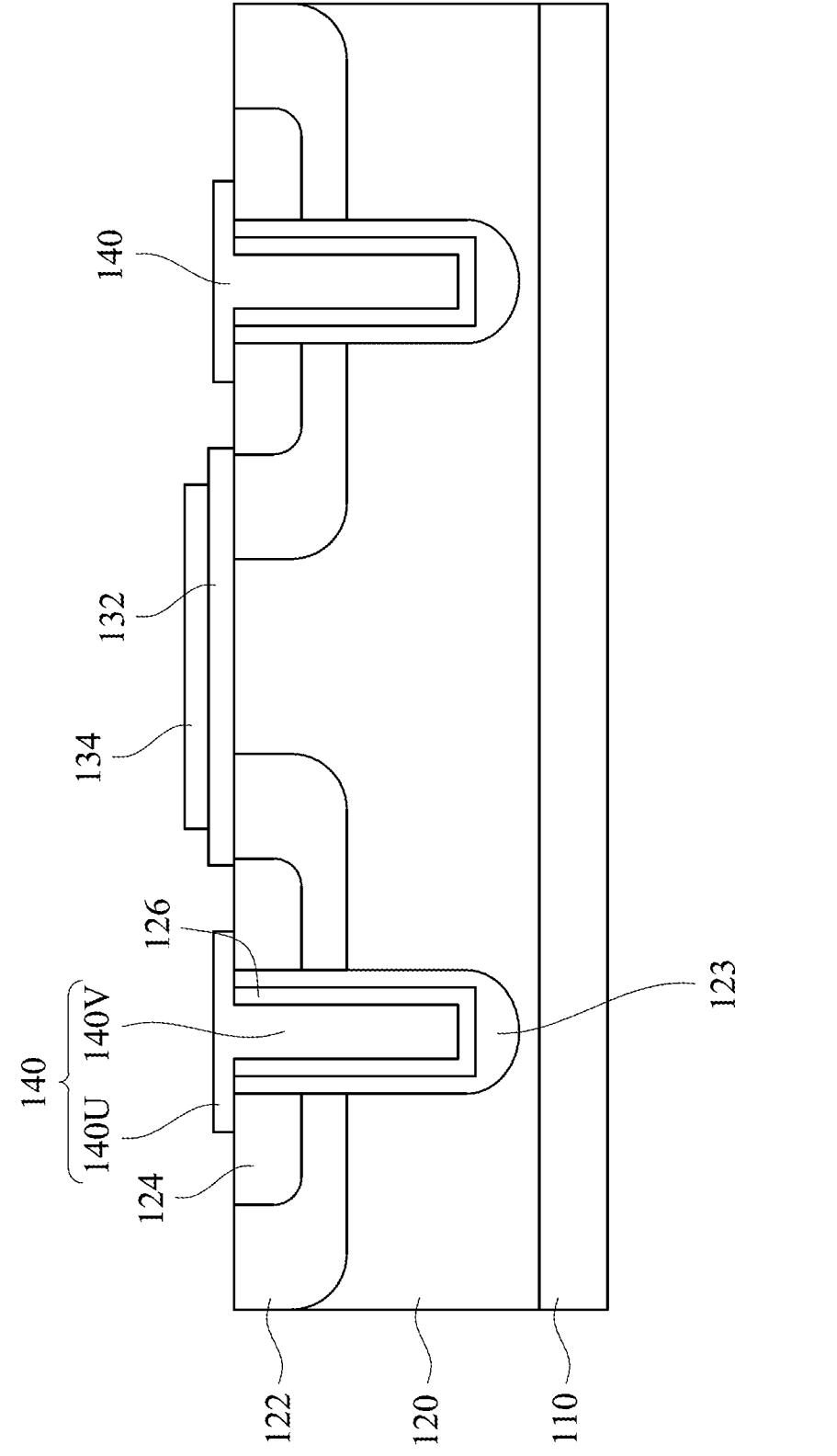

Referring to FIG. 9, the source contacts 140 are formed in the openings O. Specifically, a conductive layer is first formed on the structure in FIG. 8. Subsequently, the conductive layer is patterned to form the source contact 140 in the opening O. Subsequently, the drain electrode 150 is formed below the substrate 110. In some embodiments, the source contact 140 and the drain electrode 150 are made of (but not limited to) aluminum, titanium, titanium oxide, combinations thereof, or the like.

Figure 10:
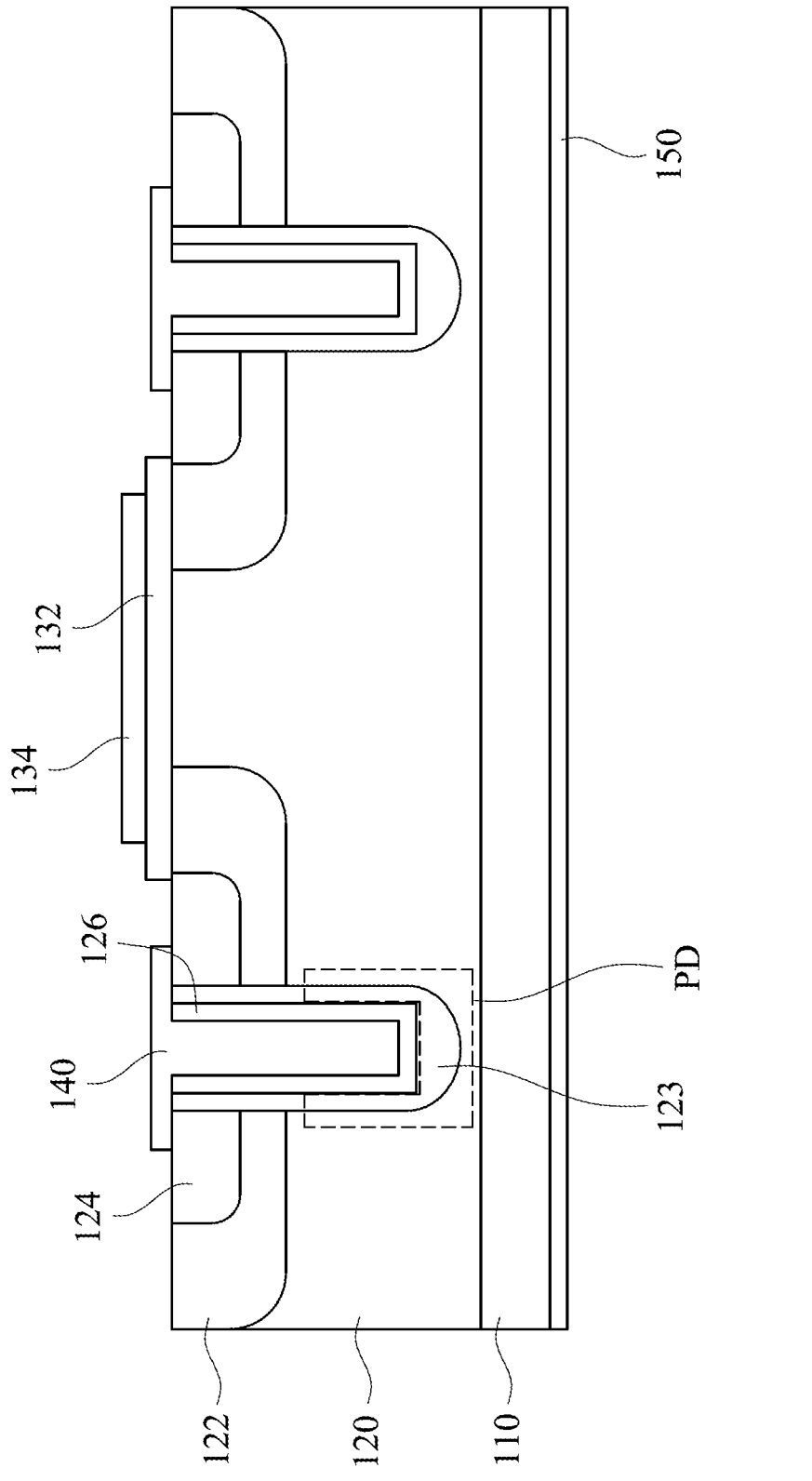

After forming the source contact 140, the base region 126 wraps around the sidewall 140S of the source contact 140, and the second well region 123 wraps around the base region 126. The source contact 140, the base region 126 and the second well region 123 extend downwards from the source region 124 to the epitaxial layer 120 below the bottom 122B of the first well region 122. The source contact 140 may include an upper portion 140U and a lower portion 140V. The upper portion 140U may be the portion formed on the top surface of the epitaxial layer 120, and the lower portion 140V may be the portion formed in the opening O. That is, the lower portion 140V of the source contact 140 and the source region 124 are separated by the base region 126. The base region 126 and the source region 124 are separated by the second well region 123. The lower portion 140V of the source contact 140 and the epitaxial layer 120 are separated by the base region 126 and the second well region 123. The second well region 123 and the base region 126 may be viewed as the parasitic diode PD of the semiconductor device 100, and the contact area between the second well region 123 and the epitaxial layer 120 may be viewed as the P-N junction of the semiconductor device 100. When the structure of the semiconductor device 100 is as shown in FIG. 10, the area of the P-N junction between the second well region 123 and the epitaxial layer 120 of the semiconductor device 100 is big, and the contact area between the source contact 140 and the base region 126 is also big. As such, the electron flow from the parasitic diode PD increases, so that the parasitic diode PD may be directly used to protect the circuit in the power module including the semiconductor device 100 and enhance overall performance, thereby reducing the cost of the power module.

FIGS. 11-19 are related to a semiconductor device 100' in some other embodiments of the present disclosure. FIGS. 11-19 use the reference numerals and a part of the descriptions of FIG. 1-10. The same reference numerals refer to the same or similar components, and repeated contents will not be described later.

Figure 11:
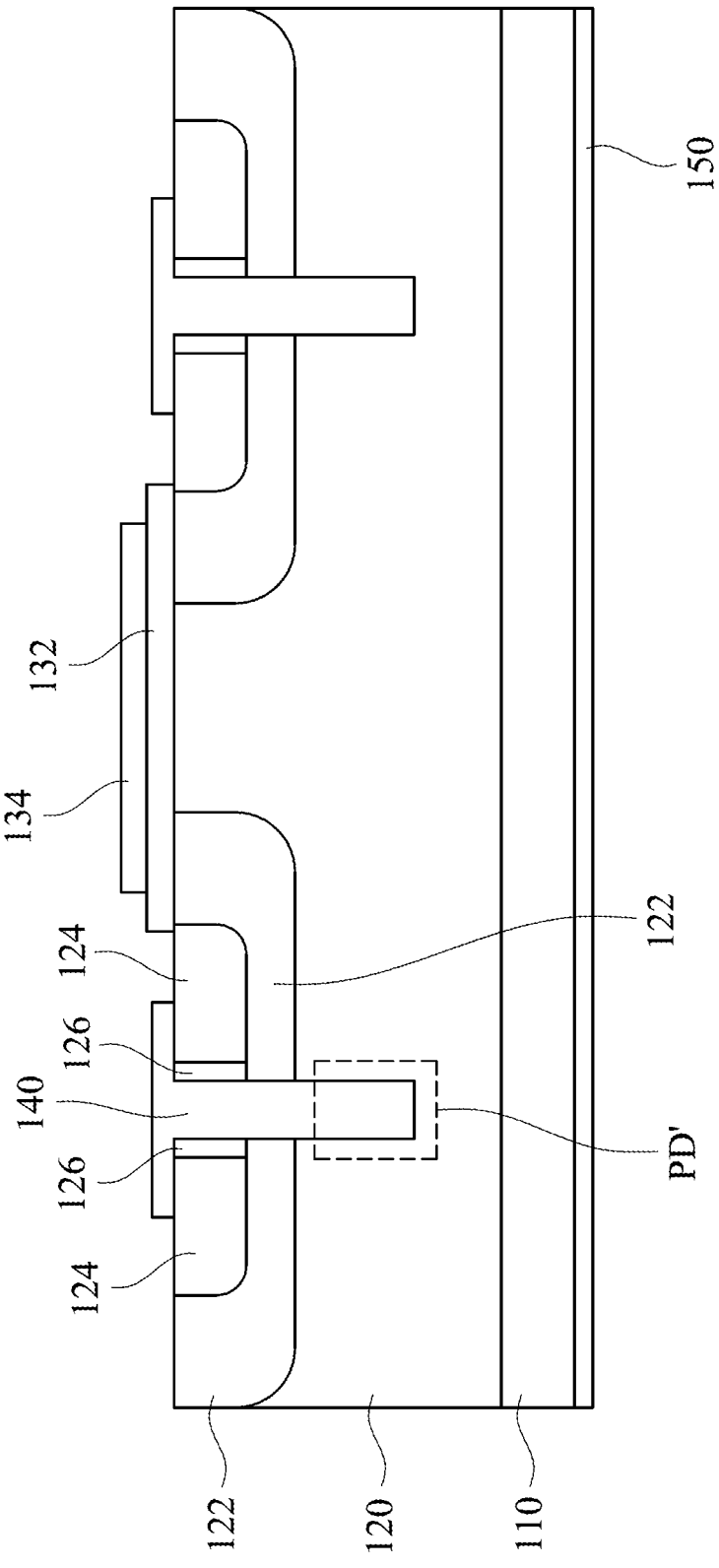
FIG. 11 illustrates a cross-section view of a semiconductor device in some other embodiments of the present disclosure.
Figure 12:
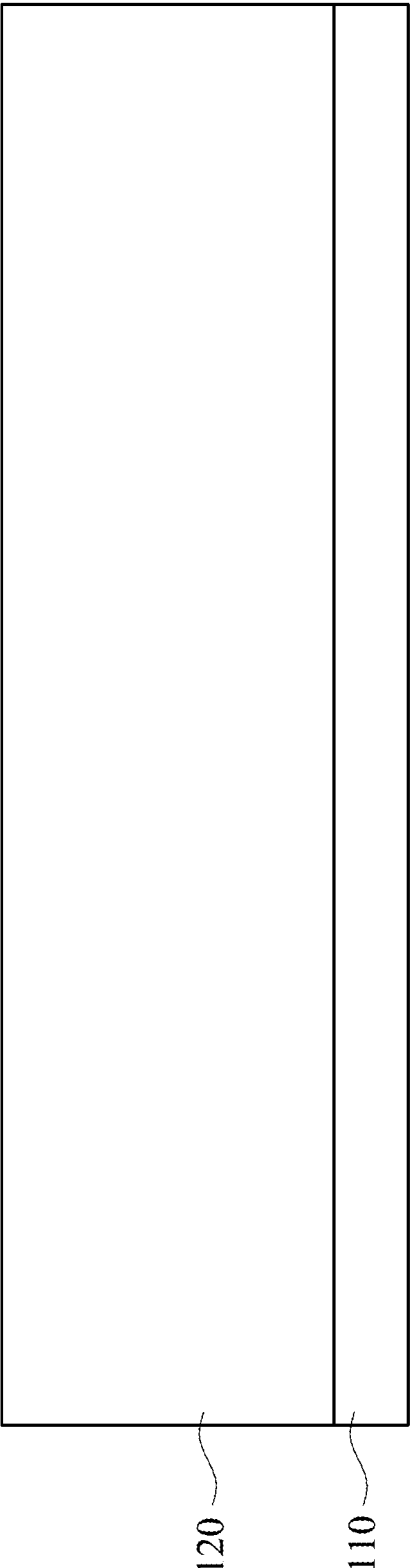
FIGS. 12-19 illustrate cross-section views of the manufacturing method of the semiconductor device in some other embodiments of the present disclosure.
Figure 13:
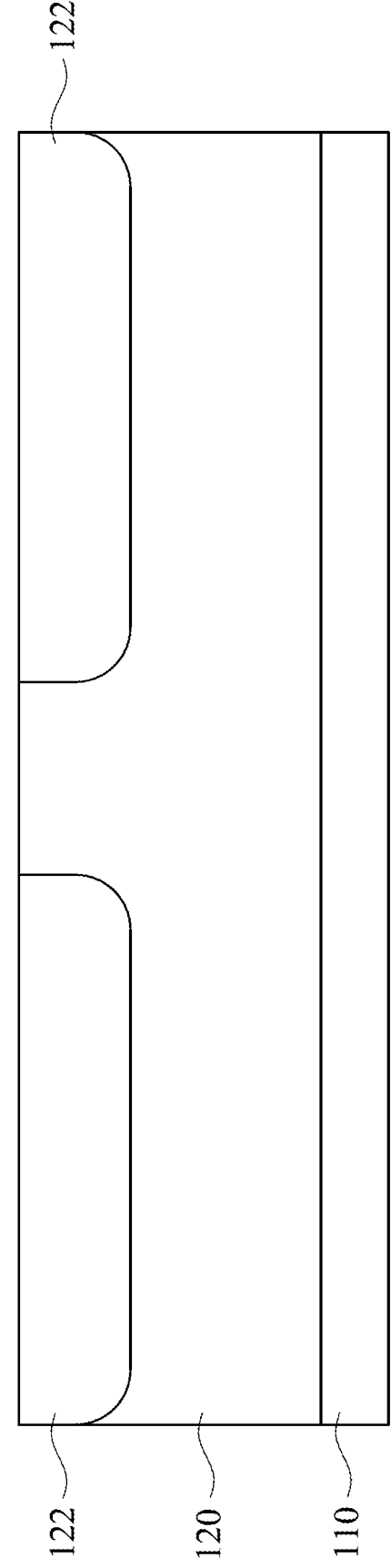
Figure 14:
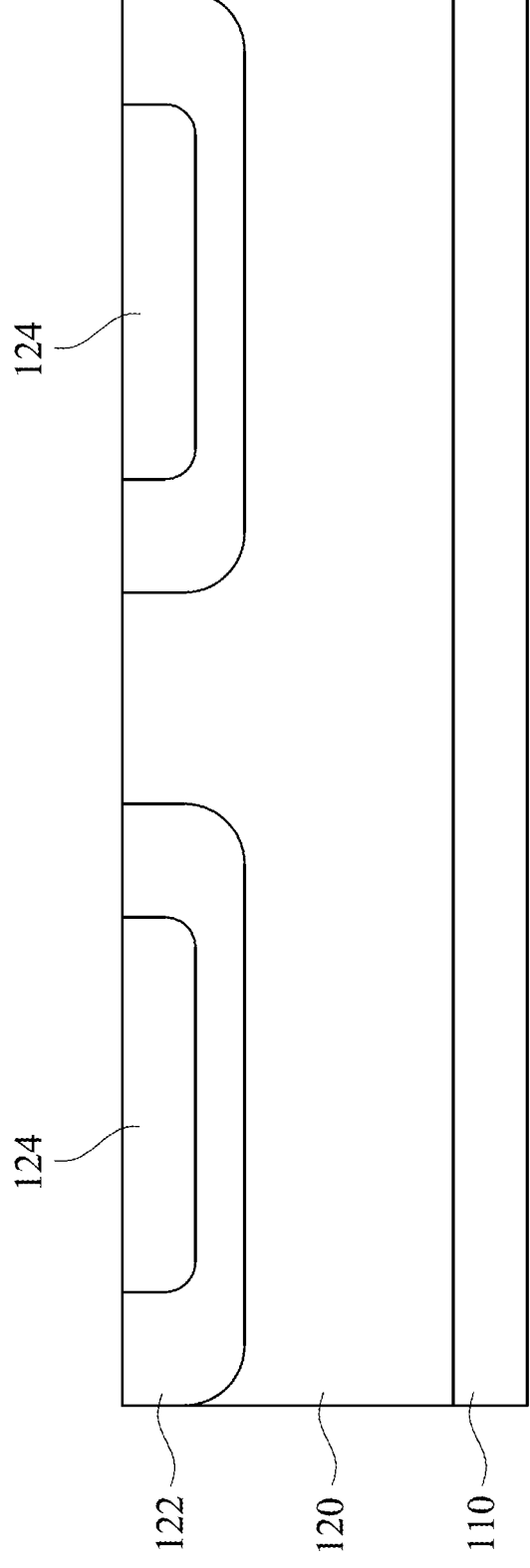
Figure 15:
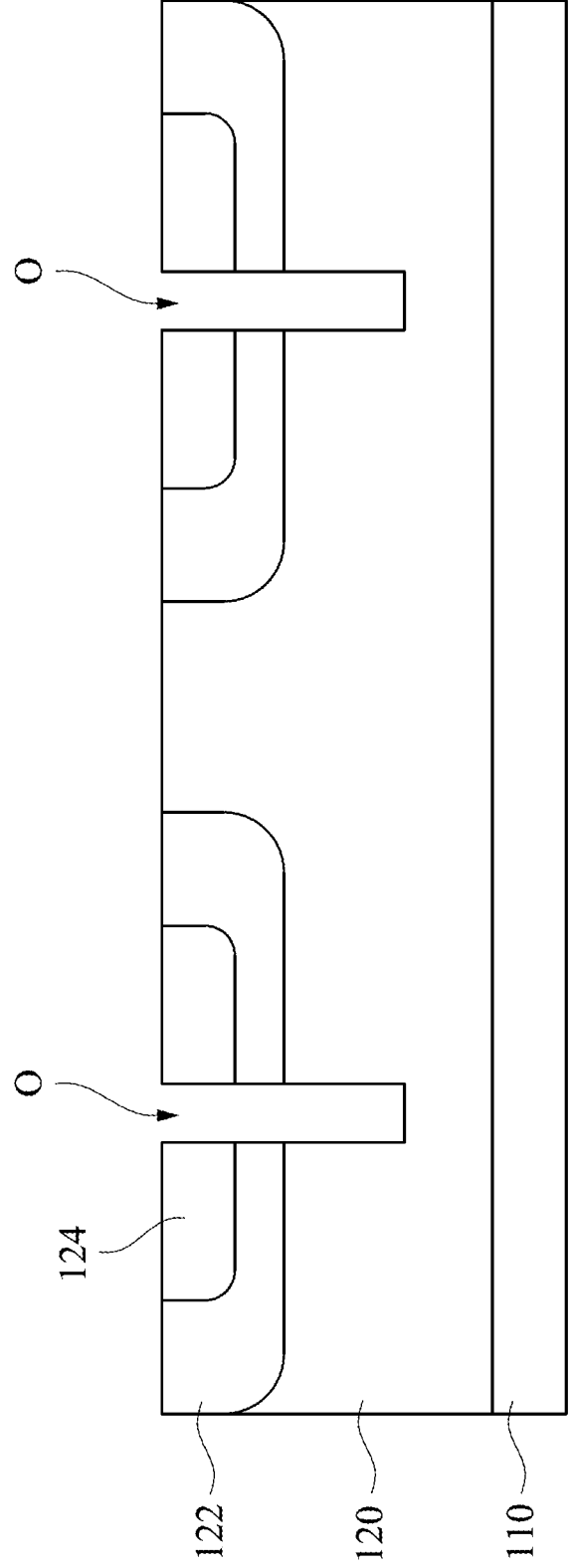

FIG. 11 illustrates a cross-section view of the semiconductor device 100' in some other embodiments. The semiconductor device 100' includes a substrate 110, an epitaxial layer 120, a well region 122, a source region 124, a source contact 140 and a base region 126.

The epitaxial layer 120 is on the substrate 110. The well region 122 is in the epitaxial layer 120. The source region 124 is in the well region 122. The substrate 110, the epitaxial layer 120 and the source region 124 include a plurality of dopants of a first semiconductor type. The base region 126 is in the well region 122. The well region 122 and the base region 126 include a plurality of dopants of a second semiconductor type. The second semiconductor type is different from the first semiconductor type, and a doping concentration of the base region 126 is higher than a doping concentration of the well region 122. The source contact 140 penetrates through a bottom 122B of the well region 122 and a bottom 126B of the base region 126. A bottom 140B of the source contact 140 is lower than the bottom 122B of the well region 122.

The semiconductor device 100' further includes a gate dielectric layer 132, a gate layer 134 and a drain electrode 150. The gate dielectric layer 132 is on the epitaxial layer 120 and covers a portion of the first well region 122. The gate layer 134 is on the gate dielectric layer 132. The drain electrode 150 is below the substrate 110.

The difference between the semiconductor device 100' in FIG. 11 and the semiconductor device 100 in FIG. 1 is that the parasitic diode PD' in FIG. 11 is a Schottky diode. Specifically, the contact area between the source contact 140 and the epitaxial layer 120 can be viewed as the Schottky junction of the parasitic diode PD'. The source contact 140 of the semiconductor device 100' extends to the epitaxial layer 120, and the bottom 140B and the sidewall 140S of the source contact 140 is directly contact with the epitaxial layer 120, so that the Schottky junction between the source contact 140 and the epitaxial layer 120 becomes bigger, thereby increasing the electron flow of the parasitic diode PD' of the semiconductor device 100'. As such, the parasitic diode PD' may be directly used to protect the overall circuit and enhance overall performance, thereby reducing the cost of the power module.

FIGS. 12-19 illustrate cross-section views of the manufacturing method of the semiconductor device 100' in some embodiments of the present disclosure. Referring to FIGS.

12-15, the substrate 110 and the epitaxial layer 120 are provided. Subsequently, in FIG. 13, a plurality of well regions 122 are formed in the epitaxial layer 120. Subsequently, in FIG. 14, the source region 124 is formed in the well region 122. Subsequently, the opening O penetrating the bottom of the source region 124 and the bottom 1226 of the epitaxial layer 120 is formed in the epitaxial layer 120.

Figure 16:
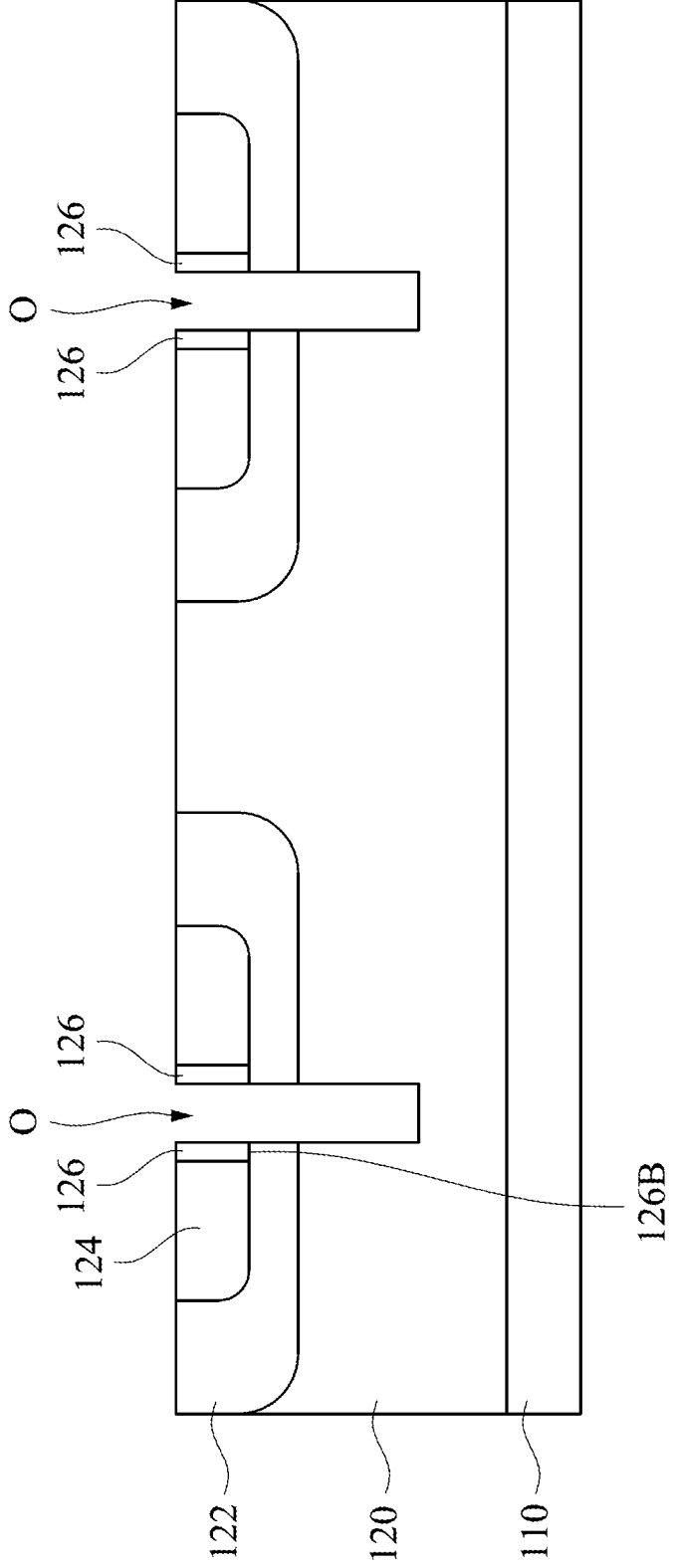

Referring to FIG. 16, the base region 126 is formed along the sidewall of the opening O and in the source region 124. Specifically, an ion implantation is performed along the sidewall of the opening O to implant the dopants of the second semiconductor type to form the base region 126 having the dopants of the second semiconductor type. The bottom 126B of the base region 126 may be contact with the well region 122, and the bottom 126B of the base region 126 does not extend to the well region 122. In some embodiments, the base region 126 may be first formed in the source region 124. Subsequently, the opening O extending to the epitaxial layer 120 is formed in the base region 126.

Figure 17:
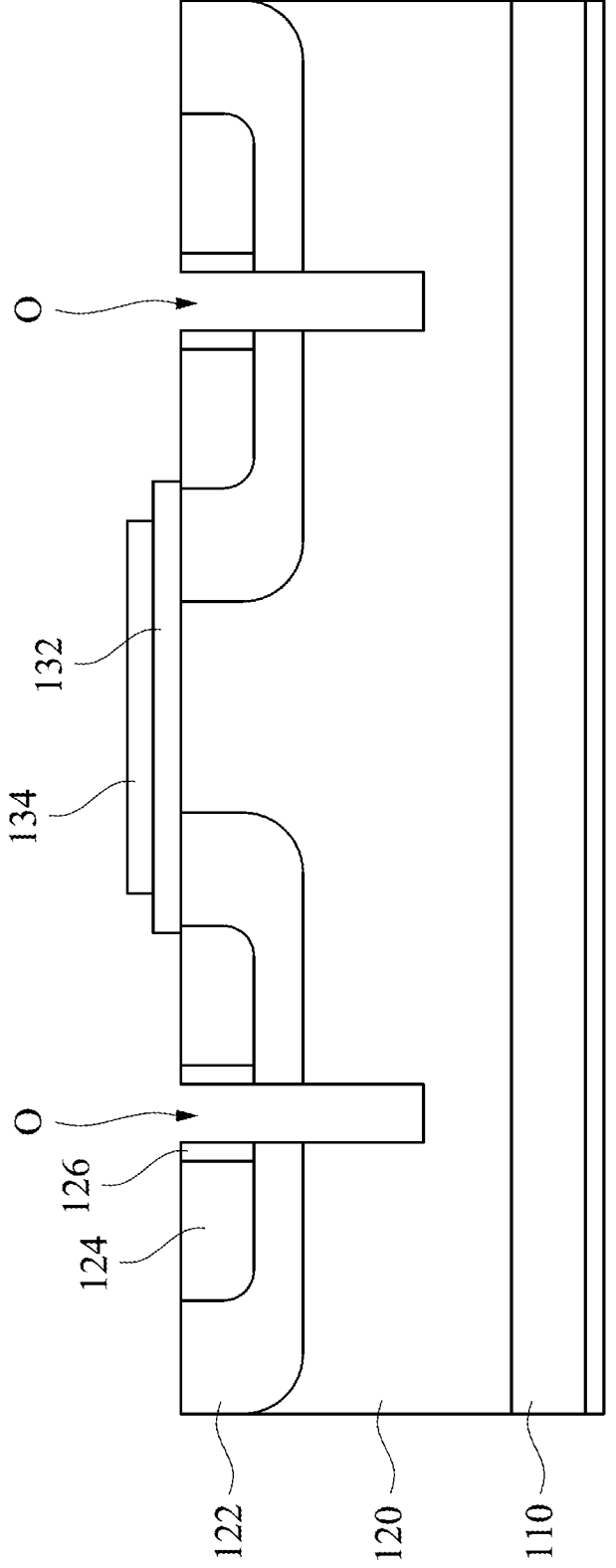
Figure 18:
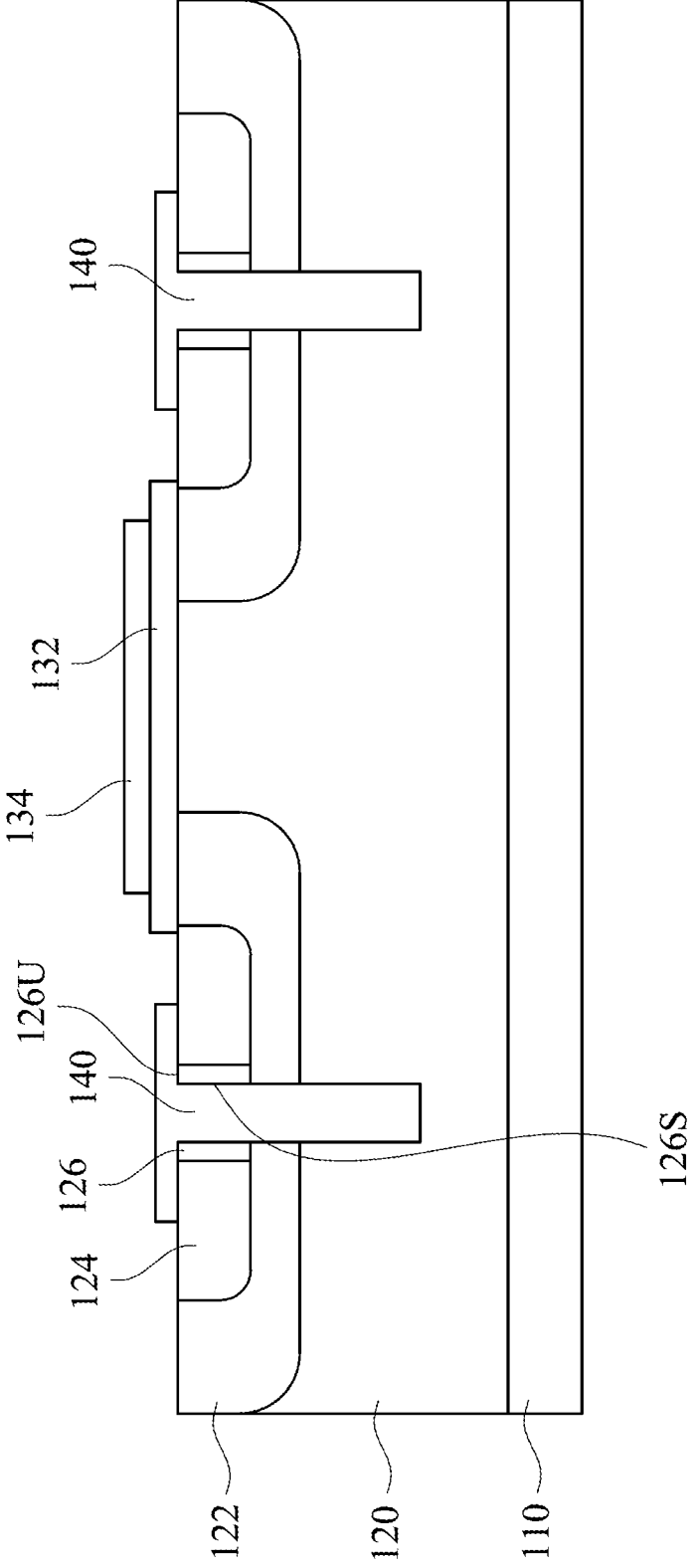
Figure 19:
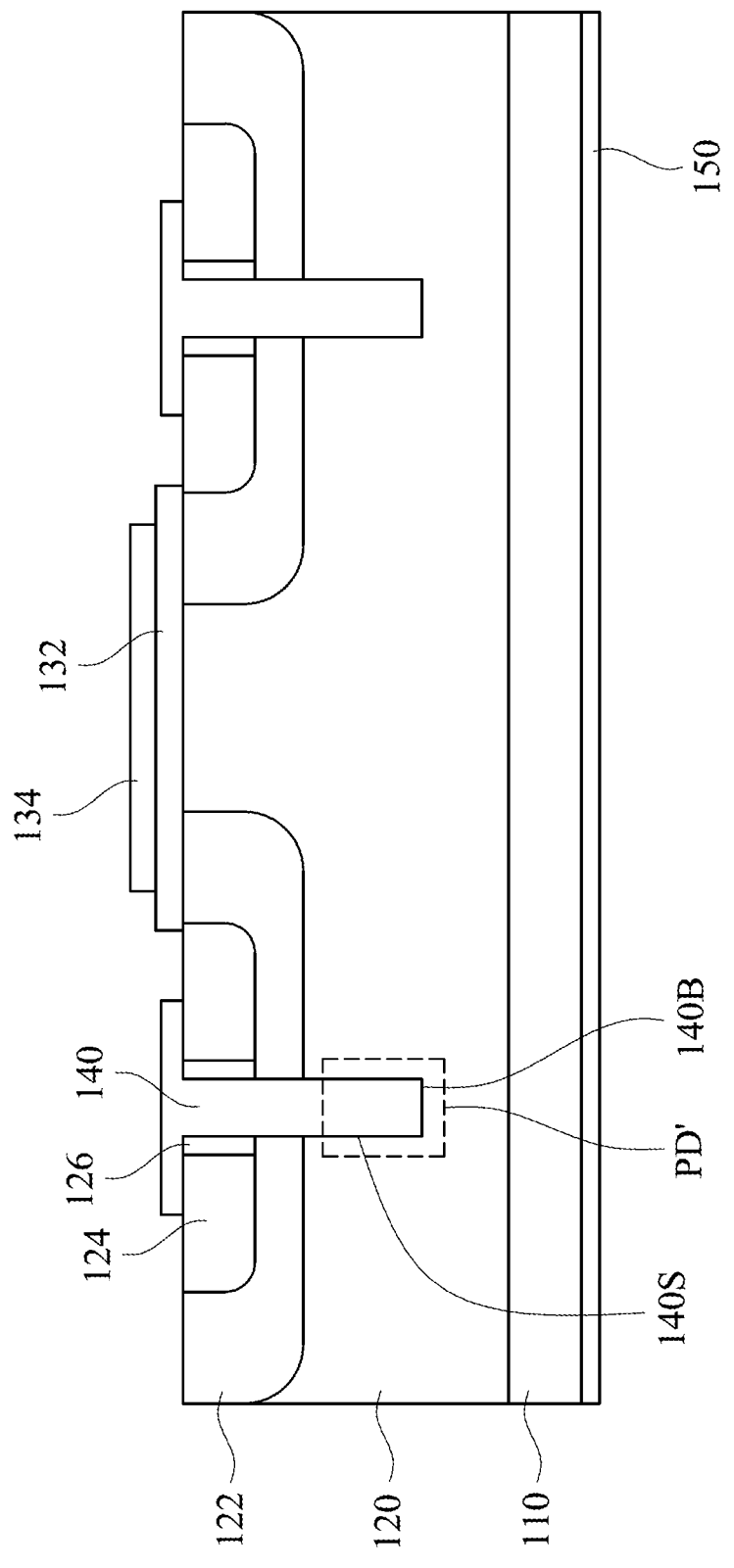

Referring to FIGS. 17-19, the gate dielectric layer 132 and the gate layer 134 are formed on the epitaxial layer 120. Subsequently, the source contact 140 is formed in the opening O, and the drain electrode 150 is formed below the substrate 110. After forming the source contact 140, the bottom 1406 and a portion of the sidewall 140S of the source contact 140 are in contact with the epitaxial layer 120. The base region 126 wraps around the other portion of the sidewall 140S of the source contact 140, and the source contact 140 and the source region 124 are at opposite sides of the base region 126. Therefore, the source region 124 is not contact with the sidewall 140S of the source contact 140. The source contact 140 is in contact with the sidewall 126S and the top portion 126U of the base region 126. The source contact 140 and the epitaxial layer 120 may be viewed as the parasitic diode PD' of the semiconductor device 100, and the contact area between the source contact 140 and the epitaxial layer 120 may be viewed as the Schottky junction of the semiconductor device 100'. When the structure of the semiconductor device 100' is as shown in FIG. 19, the area of the Schottky junction between the source contact 140 and the epitaxial layer 120 of the semiconductor device 100' is big. As such, the electron flow from the parasitic diode PD' increases, so that the parasitic diode PD' may be directly used to protect the circuit in the power module including the semiconductor device 100' and enhance overall performance, thereby reducing the cost of the power module.

It is to be understood, however, that even though numerous characteristics and advantages of the present invention have been set forth in the foregoing description, together with details of the structure and function of the invention, and changes may be made in detail, especially in matters of shape, size, and arrangement of parts within the principles of the invention to the full extent indicated by the broad general meaning of the terms in which the appended claims are expressed.

What is claimed is:

1. A semiconductor device, comprising:
   a substrate;
   an epitaxial layer on the substrate;
   a first well region in the epitaxial layer;
   a source region in the first well region, wherein the substrate, the epitaxial layer and the source region comprise a plurality of dopants of a first semiconductor type;
   a source contact, wherein a bottom of the source contact is lower than a bottom of the first well region;

a base region wrapping around a sidewall of the source contact; and a second well region wrapping around the base region, wherein the first well region, the base region and the second well region comprise a plurality of dopants of a second semiconductor type, the second semiconductor type is different from the first semiconductor type, and a doping concentration of the base region is higher than a doping concentration of the first well region and a doping concentration of the second well region, and the second well region is closer to the substrate than the first well region is.

2. The semiconductor device of claim 1, wherein a lower portion of the source contact and the source region are separated by the base region.

3. The semiconductor device of claim 1, wherein the base region and the source region are separated by the second well region.

4. The semiconductor device of claim 1, wherein a bottom of the base region is lower than the bottom of the first well region.

* * * * *